(12) United States Patent
Galasco et al.

(10) Patent No.: US 6,518,509 B1
(45) Date of Patent: Feb. 11, 2003

(54) COPPER PLATED INVAR WITH ACID PRECLEAN

(75) Inventors: Raymond T. Galasco, Vestal, NY (US); Bonnie S. McClure, Endwell, NY (US); Craig W. Richards, Chenango Forks, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/471,680

(22) Filed: Dec. 23, 1999

(51) Int. Cl.[7] .................................................. H05K 1/09
(52) U.S. Cl. ...................... 174/256; 174/262; 174/266; 361/795
(58) Field of Search ................................. 174/255, 256, 174/257, 258, 259, 260, 262, 266; 361/795, 796, 797, 798, 799

(56) References Cited

U.S. PATENT DOCUMENTS

| | | | | |
|---|---|---|---|---|
| 3,947,348 A | * | 3/1976 | Schabernack et al. | 205/151 |
| 4,791,248 A | * | 12/1988 | Oldenettel | 174/265 |
| 4,921,054 A | * | 5/1990 | Voss et al. | 174/255 |
| 4,996,115 A | * | 2/1991 | Eerkes et al. | 428/119 |
| 5,008,160 A | | 4/1991 | Jenkin | |
| 5,108,562 A | * | 4/1992 | Duke et al. | 205/660 |
| 5,231,751 A | * | 8/1993 | Sachdev et al. | 216/18 |
| 5,246,565 A | | 9/1993 | Mignardot | |
| 5,256,494 A | | 10/1993 | Tanaka et al. | |
| 5,509,200 A | * | 4/1996 | Frankeny et al. | 29/852 |
| 5,640,761 A | * | 6/1997 | DiStefano et al. | 29/830 |
| 5,768,108 A | * | 6/1998 | Miura et al. | 361/792 |
| 5,774,340 A | * | 6/1998 | Chang et al. | 174/255 |
| 5,798,563 A | * | 8/1998 | Feilchenfeld et al. | 257/668 |
| 6,098,282 A | * | 8/2000 | Frankeny et al. | 29/852 |
| 6,114,019 A | * | 9/2000 | Bhatt et al. | 428/209 |
| 6,248,958 B1 | * | 6/2001 | McClure et al. | 174/256 |
| 6,355,364 B1 | * | 3/2002 | Japp et al. | 148/516 |

OTHER PUBLICATIONS

"Process Considerations in the Fabrication of Teflon Printed Circuit Boards", by Light et al, 1994 Proceedings, 44 Electronic Components & Technology Conference, May 1994.

"High Performance Carrier Technology: Materials And Fabrication", by Light et al, 1993 International Electronics Packaging Conference, San Diego, California, vol. One.

"High Performance Carrier Technology", by Heck et al, 1993 International Electronics Packaging Conference, San Diego, California, vol. One.

* cited by examiner

Primary Examiner—Kamand Cuneo
Assistant Examiner—José H. Alcala
(74) Attorney, Agent, or Firm—Schmeiser, Olsen & Watts; Lawrence R. Fraley (57) ABSTRACT

An electronic structure that includes a copper-Invar-copper (CIC) laminate of negligible thickness, such as a thickness not exceeding about 0.5 microns. The electronic structure may have a via passes through the CIC laminate such that the via is plated with a ring of copper. The ring of copper and the copper in the CIC laminate may have about the same grain structure.

10 Claims, 9 Drawing Sheets

COPPER PLATED INVAR WITH ACID PRECLEAN

BACKGROUND OF THE INVENTION

1. Technical Field

The present invention relates to a method of forming a copper-Invar-copper (CIC) laminate having an intermetallic layer of negligible thickness, and a structure associated with the CIC laminate.

2. Related Art

Figure 1:
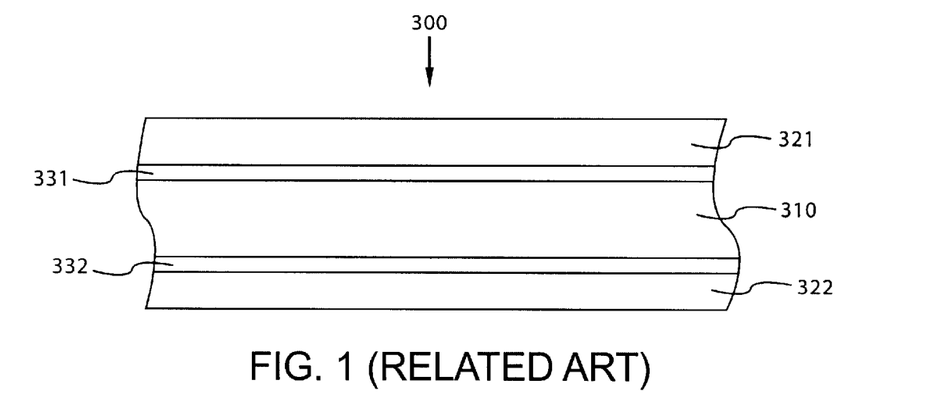
FIG. 1 a front cross-sectional view of a copper-Invar-copper (CIC) laminate, formed by rolling and annealing.

A CIC laminate includes a block of Invar sandwiched between two layers of copper. A CIC laminate of a specified thickness and having desired mechanical properties (e.g., ductility) may be formed by a process that includes cladding copper and Invar to form a layered CIC laminate, followed by rolling and annealing the layered CIC laminate to form the working CIC laminate. The rolling step starts with a feed stock of a CIC sheet and rolls the CIC sheet to the desired smaller thickness. The annealing step anneals the rolled CIC sheet at a temperature typically in a range of 760° C. to 870° C., wherein the annealing reduces the grain size in the CIC laminate. The rolling and annealing is done multiple times to achieve the desired thickness and mechanical properties of the CIC laminate. A disadvantage of the preceding process is that a copper/Invar thickness ratio in the formed CIC laminate cannot be arbitrary, because there are only several standard feed stocks of CIC, with each standard feed stock having a particular CIC/Invar thickness ratio. A second disadvantage is that a copper layer of the CIC laminate may have undesired thickness variations due to rolling defects. A third disadvantage is that the formed CIC laminate includes an undesired intermetallic layer between each copper/Invar interface, wherein the intermetallic layer has a thickness typically between 1.5 and 8 microns. The intermetallic layer, which is generated as a consequence of the temperature of the annealing, includes constituents of the CIC laminate, namely copper, iron, nickel. Thus an intermetallic layer of a CIC laminate is defined herein as a layer between a copper/Invar interface of the CIC laminate, such that the intermetallic layer includes constituents of the CIC laminate, namely copper, iron, nickel. FIG. 1 illustrates a CIC layer 300 thus formed, with an Invar layer 310 between a copper layer 321 and a copper layer 322, wherein an intermetallic layer 331 interfaces the Invar layer 310 and the copper layer 321, and wherein an intermetallic layer 332 interfaces the Invar layer 310 and the copper layer 322. Unfortunately, mechanical or laser drilling of a hole through the intermetallic layer within the formed CIC structure can generate debris from drilled material of the intermetallic layer. The generated intermetallic debris may be difficult to remove. Additionally, the debris removal by such methods as acid cleaning may result in preferential etchback of the copper or Invar in a direction normal to the surface that circumscribes the hole. The preferential etchback would result in undesired void formation within the CIC laminate adjacent to copper plating subsequently formed over the surface of the hole. If the intermetallic layer thickness were reduced or eliminated, the aforementioned problems relating to the intermetallic layer would be mitigated.

Thus, a there is a need for a method for forming a CIC laminate such that: the copper/Invar thickness ratio can have any desired value within a continuous range of values, the thickness of each copper layer is uniform, and the intermetallic layer is either eliminated or reduced in thickness.

After a CIC layer is formed according to the related art and becomes an internal layer within a dielectric substrate, drilling a through hole through the dielectric substrate generates a porous "metal skin" over a CIC surface of the through hole. The predominant constituents of the metal skin are metallic debris derived from the CIC laminate, such as copper, iron, and nickel debris, and alloys thereof. Unfortunately, a porosity of the metal skin allows processing chemicals, such as acid solutions, to become trapped between the metal skin and the CIC surface covered by the metal skin. As a consequence of the metal skin, a pocket void may form within the Invar layer of the CIC laminate due to galvanic action on a galvanic cell comprising a copper layer of the CIC laminate, the block of Invar of the CIC laminate, and the acid solution. Thus, a method is needed to form a dielectric substrate having CIC layer and a hole therethrough, wherein a metal skin is not generated.

SUMMARY OF THE INVENTION

The present invention provides a method for forming an electronic structure, comprising the steps of:

providing a block of Invar;

cleaning the block of Invar with an acid solution, while applying a negative voltage bias to the block of Invar; and electroplating copper on the block of Invar to form a copper-Invar-copper (CIC) laminate.

The present invention provides an electronic structure that includes a copper-Invar-copper (CIC) laminate, said CIC laminate comprising:

a block of Invar;

a first layer of copper;

a second layer of copper, wherein the block of Invar is sandwiched between the first layer of copper and the second layer of copper;

a first intermetallic layer disposed between the block of Invar and the first layer of copper, said first intermetallic layer having a thickness not exceeding about 0.50 microns; and a second intermetallic layer disposed between the block of Invar and the second layer of copper, said second intermetallic layer having a thickness not exceeding about 0.50 microns.

The present invention provides a method for cleaning a block of Invar, comprising the steps of:

providing a block of Invar; and cleaning the block of Invar with an acid solution, while applying a negative voltage bias to the block of Invar.

The present invention has the advantages of forming a CIC laminate such that the copper/Invar thickness ratio can have any value within a continuous range of values, the thickness of each copper layer is uniform, and any resulting intermetallic layer has a thickness not exceeding about 0.50 microns.

The present invention has the advantage of forming a dielectric substrate having a CIC internal layer and a hole through the dielectric substrate, wherein a metal skin is not generated even though the hole passes through the CIC internal layer.

DETAILED DESCRIPTION OF THE INVENTION

Figure 2:
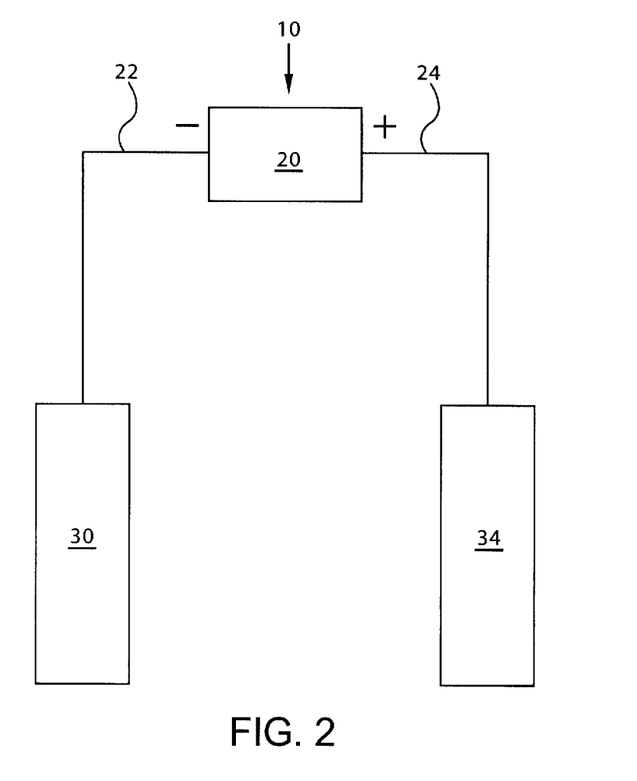
FIG. 2 depicts front cross-sectional view of a circuit element having an block of Invar and a conductive anode, in accordance with a first preferred embodiment of the present invention.
Figure 3:
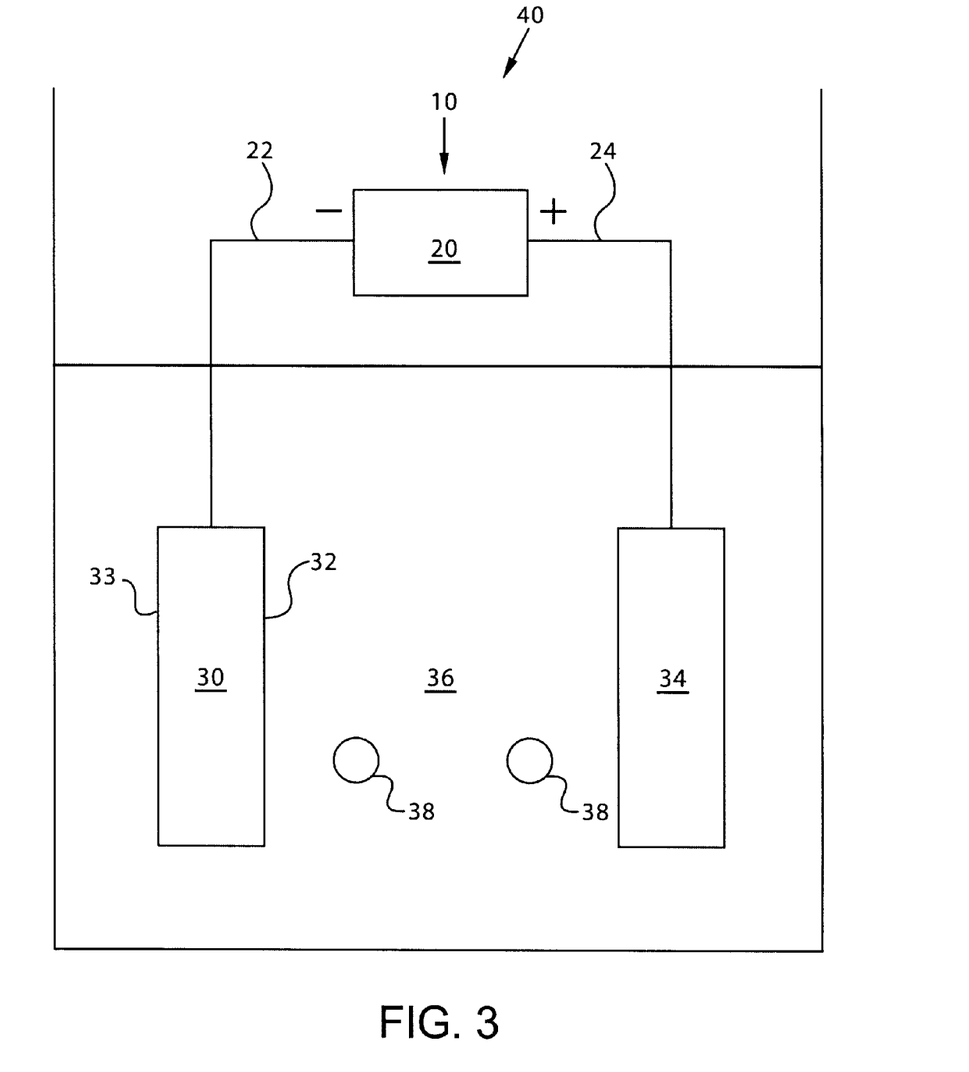
FIG. 3 depicts FIG. 2 with the block of Invar and the conductive anode immersed in an acid solution.
Figure 4:
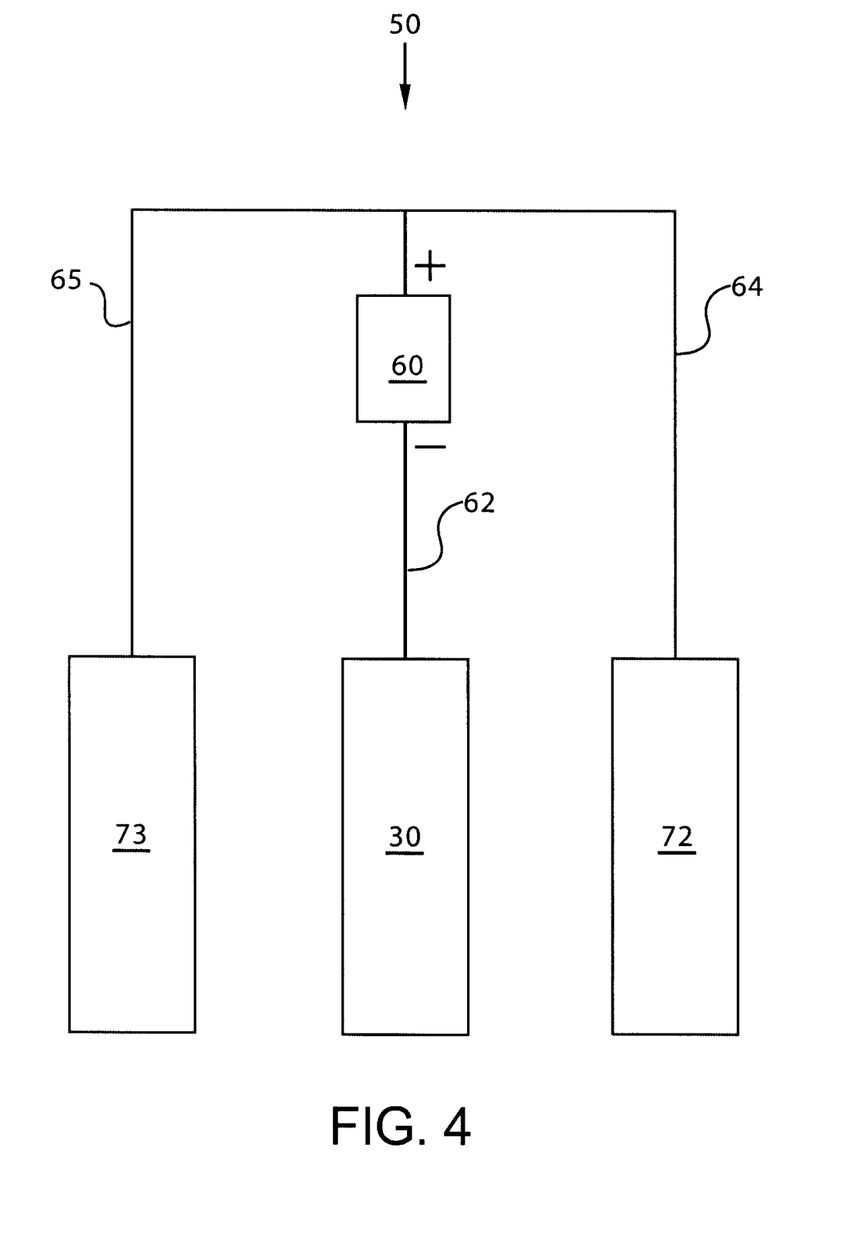
FIG. 4 depicts a front cross-sectional view of a circuit element having the block of Invar of FIG. 3 and two copper anodes, in accordance with the first preferred embodiment of the present invention.
Figure 5:
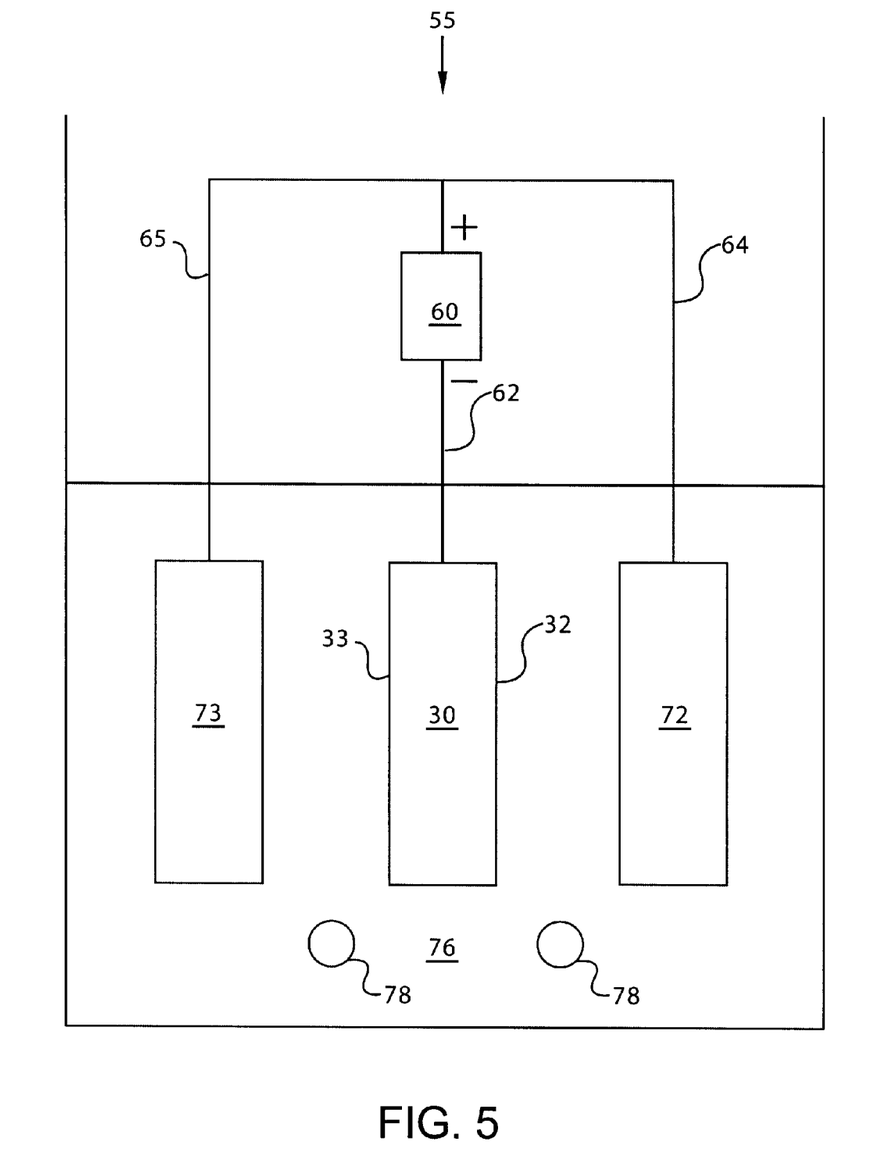
FIG. 5 depicts FIG. 4 with the block of Invar and the two copper anodes immersed in an acid solution.

FIGS. 2–3 illustrate cleaning a block of Invar 30 with an acid solution, and FIGS. 4–5 illustrate electroplating the block of Invar 30 with copper to form a copper-Invar-copper (CIC) laminate, in accordance with a first preferred embodiment of the present invention. The block of Invar 30 comprises Invar which is an alloy that includes iron and nickel. FIG. 2 illustrates a front cross-sectional view of a circuit element 10. The circuit element 10 comprises a power supply 20, the block of Invar 30 conductively coupled by an electrical coupler 22 (e.g., a conductive wire) to a negative terminal of the power supply 20, and a conductive anode 34 conductively coupled by an electrical coupler 24 (e.g., a conductive wire) to a positive terminal of the power supply 20. The block of Invar 30 may include a sheet of Invar, or a portion of a roll of Invar. The conductive anode 34 may be a plate, a screen, or have any other geometrical shape. The conductive anode 34 preferably includes any conductive material, such as titanium or platinized titanium (i.e., titanium plated with platinum), that is inert (or substantially inert) to an acid solution that will subsequently contact the conductive anode 34. The power supply 20 is turned on to a voltage output preferably between about 2 volts and about 5 volts, and preferably prior to the subsequent step of immersing the block of Invar 30 and the conductive anode 34 into the acid solution.

FIG. 3 illustrates FIG. 2 with the block of Invar 30 and the conductive anode 34 immersed in an acid solution 36. As stated previously, the block of Invar 30 may include a sheet of Invar, or a portion of a roll of Invar. If the block of Invar 30 includes the sheet of Invar, then the sheet of Invar may remain fixed in position, or be agitated, after being immersed in the acid solution 36. If the block of Invar 30 includes the portion of a roll of Invar, then an unrolled portion of the roll of Invar is moved through the acid solution 36 such that at any instant of time, the block of Invar 30 includes a section of the roll of Invar that is immersed in the acid solution 36. The acid solution 36 preferably includes sulfuric acid, but may alternatively include any other inorganic acid, such as hydrochloric acid, or a mixture of sulfuric acid and phosphoric acid. If the acid solution 36 includes an inorganic acid other than an inorganic acid in the acid solution 76 of the electroplating process depicted in FIG. 5, then the inorganic acid of the acid solution 36 should cleaned away from the block of Invar 30, such as by using a pulsed water rinse, after the block of Invar 30 has been removed from the acid solution 36, so as not to mix with the inorganic acid in the acid solution 76 of the electroplating process depicted in FIG. 5. If the block of Invar 30 and the conductive anode 34 make a "live entry" into the acid solution 36 (i.e., the power supply 20 is turned on prior to immersion), an electrical circuit structure 40 is immediately formed upon immersion of the block of Invar 30 and the conductive anode 34 into the acid solution 36. In the absence of a live entry, the electrical circuit structure 40 is formed immediately after the power supply 20 is turned following the immersion. The electrical circuit structure 40 includes a negative voltage bias across the block of Invar 30. The negative voltage bias facilitates cleaning the block of Invar 30 by reducing oxides that exist on the surfaces 32 and 33 of the block of Invar 30. Such surface oxides include oxides of nickel and oxides of iron, inasmuch as Invar comprises nickel and iron. The chemistry of the oxide reduction depends on the specific oxides which are present. For example, the following reduction reactions are possible, depending on whether any of the oxides NiO, $Ni_3O_4$, FeO, and $Fe_3O_4$ are present:

$NiO+2H^++2e^- \rightarrow Ni+H_2O$ $Ni_3O_4+2H^-+2e^- \rightarrow 3NiO+H_2O$ $FeO+2H^++2e^- \rightarrow Fe+H_2O$ $Fe_3O_4+8H^++8e^- \rightarrow 3Fe+4H_2O$ Other reactions are possible, including reactions in which there is direct reduction of metal alloy oxides.

The electron circulation pattern in FIG. 3 is as follows. The voltage from the power supply 20 generates electrons by ionizing water in the vicinity of the conductive anode 34 according to:

$$2H_2O \rightarrow 4H^++O_2+4e^- \tag{1}$$

Additionally, if the acid solution 36 includes hydrochloric acid, chlorine gas will also be generated the vicinity of the conductive anode 34. The electrons generated according to Equation (1) travel through the conductive anode 34, through the electrical coupler 22, through the power supply 20, through the electrical coupler 24, and into the block of Invar 30 as well as along the surfaces 32 and 33 of the block of Invar 30. The electrons at the surfaces 32 and 33 of the block of Invar 30 participate in the reduction of surface oxides. Additionally, the electrons at the surfaces 32 and 33 of the block of Invar 30 interact with hydrogen ions (supplied by the acid solution 36) to generate bubbles of hydrogen gas at the surfaces 32 and 33 according to:

$$2H^++2e^- \rightarrow H_2 \tag{2}$$

The hydrogen bubbles at the surfaces 32 and 33 protects the surfaces 32 and 33 from further oxidation. Thus, in the present invention, the bias voltage in combination with the conductive anode 34 both removes oxides and prevents oxides from forming on the surfaces 32 and 33 of the block of Invar 30. As a result, the block of Invar 30 is thoroughly cleaned, and nucleation sites (e.g., cracks, interstitial areas, grain boundaries) on the surfaces 32 and 33 of the block of Invar 30 are generated, to facilitate good adhesion in the subsequent electroplating of copper on the surfaces 32 and 33 of the block of Invar 30, as described infra in conjunction with FIGS. 4–5.

For the electrical circuit structure 40 of FIG. 3, a current density at the surfaces 32 and 33 should preferably be between about 1 and 10 amps/ft². The time during which the block of Invar 30 is immersed in the acid solution 36 under the negative voltage bias should preferably be between about 1 minute and about 10 minutes. If the immersion time exceeds about 10 minutes, the present invention will work properly, but the excess time may be unnecessary. The cleaning process should preferably terminate with a "live exit"; i.e., the power supply 20 should be preferably turned off after removing the block of Invar 30 from the acid solution 36, in order to protect against oxidizing the block of Invar 30 in the acid solution 36.

A small concentration of copper ions 38 may optionally be included in the acid solution 36. If present, some of the copper ions 38 will plate in small spots on the surfaces 32 and 33 of the block of Invar 30 in accordance with the following reaction:

The spot copper plating in the cleaning step acts as a "starter" that promotes better adhesion with copper that will plated on the surfaces 32 and 33 of the block of Invar 30 in the subsequent electroplating step, as described infra in conjunction with FIGS. 4–5, to form the copper layers of the CIC laminate. The small concentration of the copper ions 38 in the acid solution 36 should be less than about 3 gram/liter; too high a concentration of copper may prevent some of the aforementioned reduction reactions from occurring.

As stated previously, the power supply 20 should be turned on preferably prior to immersing the block of Invar 30 into the acid solution 36. It is especially beneficial to turn on the power supply 20 prior to the immersion step if the acid solution 36 includes the small concentration of copper ions 38. If power is turned on after immersing the block of Invar 30 into the acid solution 36, there will be no negative voltage applied to the block of Invar 30 at the instant of immersion. Without the negative voltage bias, iron from the block of Invar 30 may dissolve into the acid solution 36, and copper ions 38 may plate unto the surfaces 32 and 33 where the iron is dissolving, resulting in locations on the surfaces 32 and 33 at which copper may electroplate with inadequate adhesion in the subsequent electroplating step.

As stated previously, the power supply 20 should be turned off preferably after removing the block of Invar 30 from the acid solution 36. It is especially beneficial to turn off the power supply 20 after removing the block of Invar 30 from the acid solution 36 if the acid solution 36 includes the small concentration of copper ions 38. When power turned is off, the negative voltage bias on the block of Invar 30 disappears. Without the negative voltage bias while the block of Invar 30 is immersed in the acid solution 36, iron from the block of Invar 30 may dissolve into the acid solution 36, and copper ions 38 may plate unto the surfaces 32 and 33 where the iron is dissolving, resulting in locations on the surfaces 32 and 33 at which copper may electroplate with inadequate adhesion in the subsequent electroplating step.

While FIG. 3 shows one conductive anode 34, two or more conductive anodes may be immersed in the acid solution 36, such that each conductive anode is conductively coupled to the positive terminal of the power supply 20. As an example, if FIG. 3 depicts two conductive anodes, the two conductive anodes may be positioned in the acid solution 36 on opposite sides of the block of Invar 30.

FIGS. 4–5 illustrate electroplating the block of Invar 30 with copper to form the CIC laminate, following the procedure for cleaning the block of Invar 30 that was described infra for FIGS. 2 and 3. FIG. 4 illustrates a front cross-sectional view of a circuit element 50. The circuit element 50 comprises a power supply 60, the block of Invar 30 conductively coupled by an electrical coupler 62 (e.g., a conductive wire) to a negative terminal of the power supply 60, and copper anodes 72 and 73, conductively coupled by an electrical coupler 64 and 65 (e.g., conductive wires), respectively, to a positive terminal of the power supply 60. The power supply 60 is turned on to a voltage output preferably between about 0.1 and about 10 volts, and preferably prior to the subsequent step of immersing the copper anodes 72 and 73 into an acid solution.

FIG. 5 depicts FIG. 4 with the block of Invar 30 and the copper anodes 72 and 73 immersed in an acid solution 76. The acid solution 76 includes a source of cooper ions such as copper sulphate, and an inorganic acid (e.g., sulfuric acid) capable of interacting with copper so as to generate copper ions in the acid solution 76. The copper ions should have a concentration in the acid solution between about 15 grams/liter and about 25 grams/liter. If the acid solution 76 includes sulfuric acid, then the acid solution should preferably include about 150 grams/liter to about 300 grams/liter of sulfuric acid. The acid solution preferably includes a chloride having a concentration preferably between about 30 ppm and about 100 ppm by weight. The chloride, along with appropriate organic additives such as HY70/30 manufactured by Enthone-OMI, advantageously contributes to controlling the grain structure of the copper plating and also contributes to controlling the copper plating acquiring its desired physical properties (e.g., ductility). The copper electroplating of the present invention will work without the chloride, but will lack the aforementioned advantage attributable to the chloride. A source of the chloride includes, inter alia, hydrochloric acid. If the block of Invar 30 and the copper anodes 72 and 73 make a "live entry" into the acid solution 76, an electrical circuit structure 55 is immediately formed upon immersion of the block of Invar 30 and the copper anodes 72 and 73 into the acid solution 76. In the absence of a live entry, the electrical circuit structure 55 is formed immediately after the power supply 60 is turned following the immersion. The electrical circuit structure 55 includes a negative voltage bias across the block of Invar 30. The negative voltage bias facilitates plating the block of Invar 30 with copper to form the CIC laminate 80 shown in FIG. 6.

In FIG. 5, the block of Invar 30 should be positioned between the copper anodes 72 and 73 such that the copper anode 72 serves as a primary source of copper ions for plating the surface 32, and the copper anode 73 serves as a primary source of copper ions for plating the surface 33. The copper plating will be spatially uniform on each of the surfaces 32 and 33. As stated previously, the power supply 60 should be turned on preferably prior to immersing the block of Invar 30 into the acid solution 76. If power is turned on after immersing the block of Invar 30 into the acid solution 76, there will be no negative voltage applied to the block of Invar 30 at the instant of immersion. Without the negative voltage bias, iron from the block of Invar 30 may dissolve into the acid solution 76, and copper ions 78 may plate unto the surfaces 32 and 33 where the iron is dissolving, resulting in locations on the surfaces 32 and 33 at which copper ions 78 electroplate with inadequate adhesion.

The electroplating of copper should be done at an acid solution temperature range between about 24° C. and about 40° C., preferably at about 30° C. The preceding electroplating temperature range is low enough to avoid an intermetallic layer that ordinarily forms at the much higher annealing temperatures of the CIC formation process that was described infra in the "Related Arts" section. The electroplating temperatures of the present invention will result either in no intermetallic layer or in an intermetallic layer having a thickness not exceeding about 0.50 microns. This upper limit thickness of about 0.50 microns for the intermetallic layer, which includes a possibility that no intermetallic layer is formed (i.e., zero thickness for the intermetallic layer), is based on tests with scanning electron microscopy instrumentation. The tests were unable to detect an intermetallic layer in CIC substrates formed by the process of the present invention and the instrumental measurement tolerance was about 0.50 microns. Thus, it is consistent with the results of the preceding tests that no intermetallic layer is formed from the electroplating of the present invention. The preceding tests were in accordance with the following parameters: an acid solution temperature between 26° C. and 29 ° C., a sulfuric acid concentration of 180 grams/liter, a copper ion concentration between 18 and 22 grams/liter, a chloride concentration between 40 and 60 ppm, and an organic additive HY70/30 (manufactured by Enthone-OMI) concentration of 0.2 m/liter.

The current density at the surfaces 32 and 33 of the block of Invar 30 should preferably be between about 5 and 120 amps/ft$^2$. The time during which the block of Invar 30 is immersed in the acid solution 76 under the negative voltage bias depends on the thickness of copper plating desired, since the plating thickness varies with the time of immersion under the negative voltage bias. Thus, the user of the present invention can control a copper/Invar thickness ratio by adjusting the immersion time.

FIG. 5 shows two copper anodes, namely the copper anode 72 and the copper anode 73. Nonetheless, the present invention is applicable to a configuration having only one copper anode (i.e., either the copper anode 72 or the copper anode 73), such that the only one copper anode causes electroplating of only one of the two sides of the block of Invar 30, namely the side that faces the only one copper anode. The one-sided electroplating could be accomplished with the only one copper anode by forming, prior to immersing the block of Invar 30 in the acid solution 36, a protective cover on the side of the block of Invar 30 that is not to be electroplated. An example of the protective covering is a dielectric photoresist. If the protective covering includes a negatively-acting photoresist, the photoresist should be exposed to radiation, such as ultraviolet radiation, prior to immersing the block of Invar 30 in the acid solution 36, in order to make the photoresist resistant to chemical attack when subsequently exposed to the acid solution 36. After the electroplating is complete and the block of Invar 30 is removed from the acid solution 36, the dielectric photoresist may be chemically stripped from the block of Invar 30 by using a stripping chemical that does not attack the copper or the Invar that exists in the electroplated block of Invar 30.

Figure 6:
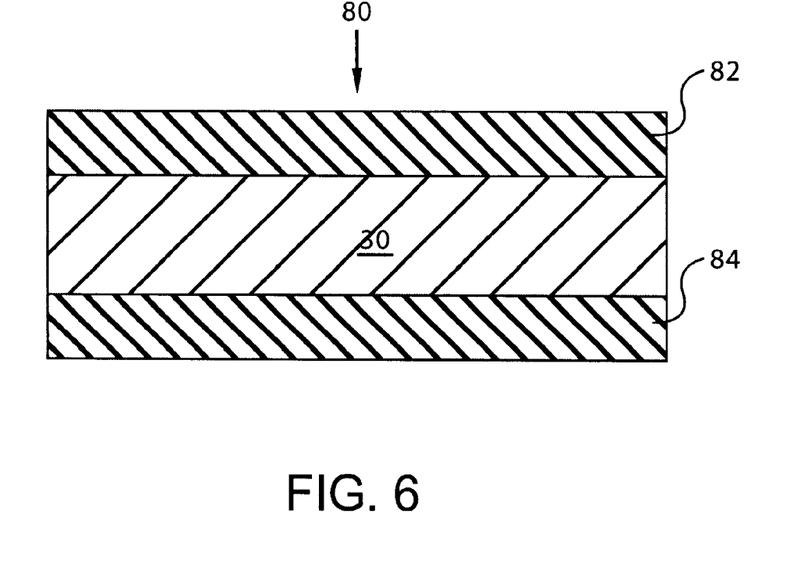
FIG. 6 depicts a CIC laminate resulting from the process associated with FIGS. 2–5.

FIG. 6 illustrates a CIC laminate 80 resulting from the electroplating process associated with FIGS. 2–5. The CIC laminate 80 includes the block of Invar 30 sandwiched between the copper layers 82 and 84 resulting from the electroplating of the block of Invar 30. FIG. 6 does not show an intermetallic layer within the CIC laminate 80, since any such intermetallic layer of the present invention, if present, would have a thickness not exceeding about 0.50 microns. In contrast, the intermetallic layers 331 and 332 within the CIC laminate 300 of FIG. 1 each have a thickness between 1.5 and 8 microns, as discussed infra in the "Related Art" section.

Figure 7:
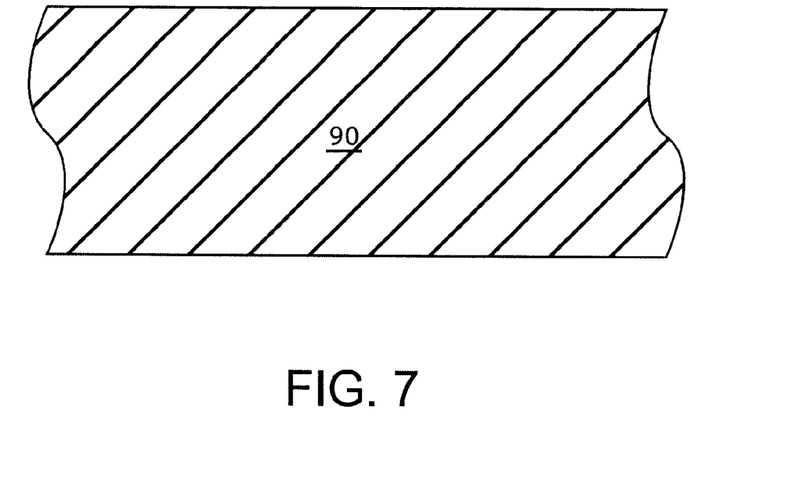
FIG. 7 depicts a block of Invar, in accordance with a second preferred embodiment of the present invention.
Figure 8:
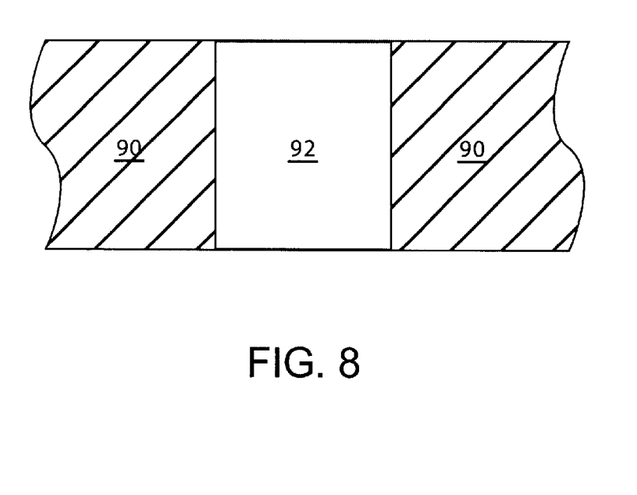
FIG. 8 depicts FIG. 7 after a via has been formed through the block of Invar.

FIG. 7 illustrates a block of Invar 90, in accordance with a second preferred embodiment of the present invention. FIG. 8 illustrates FIG. 7 after a via 92 has been formed, such as by mechanical or laser drilling, through the block of Invar 90. Next, the block of Invar 90 is cleaned by the process described infra for FIGS. 2 and 3.

Figure 9:
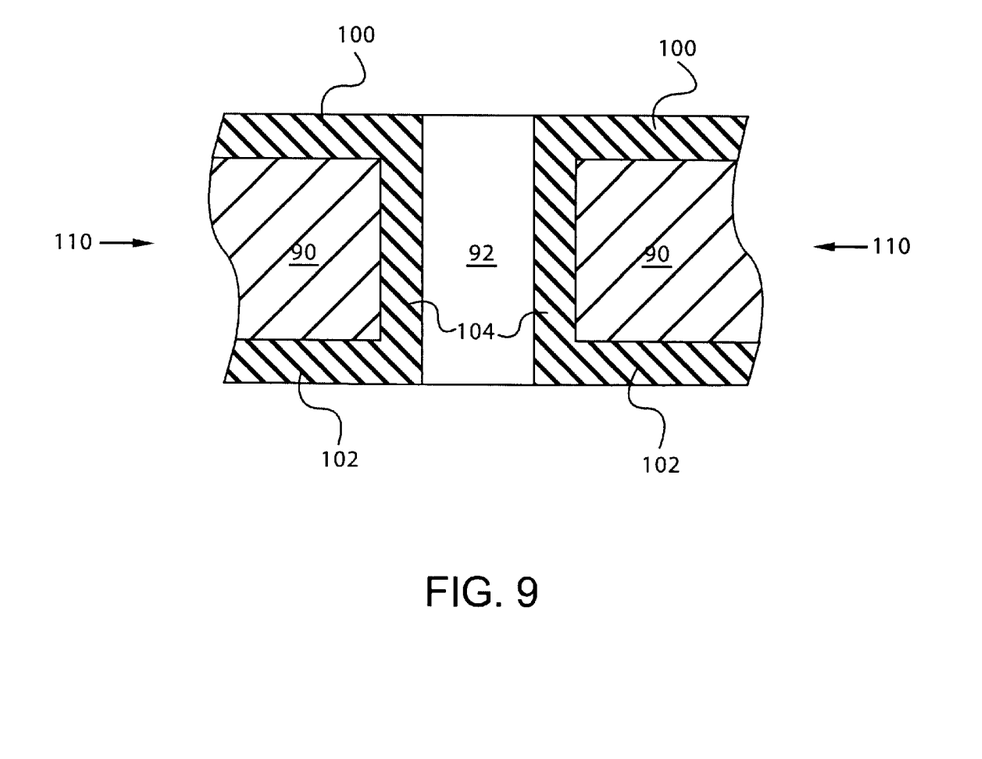
FIG. 9 depicts FIG. 8 after the block of Invar and the via have been electroplated with copper.

Following the aforementioned cleaning, the block of Invar 90 is electroplated with copper in accordance with the process described infra for FIGS. 4 and 5. FIG. 9 illustrates the block of Invar 90 after the electroplating such that the block of Invar 90 is sandwiched between copper layers 100 and 102 to form a CIC laminate 110, and the via 92 has been plated with a ring of copper 104. As a consequence of the electroplating procedure of the present invention, the ring of copper 104 makes a seamless, and thus particularly reliable, connection with the copper layers 100 and 102, because the ring of copper 104 and the copper layers 100 and 102 each have the same grain structure.

Figure 10:
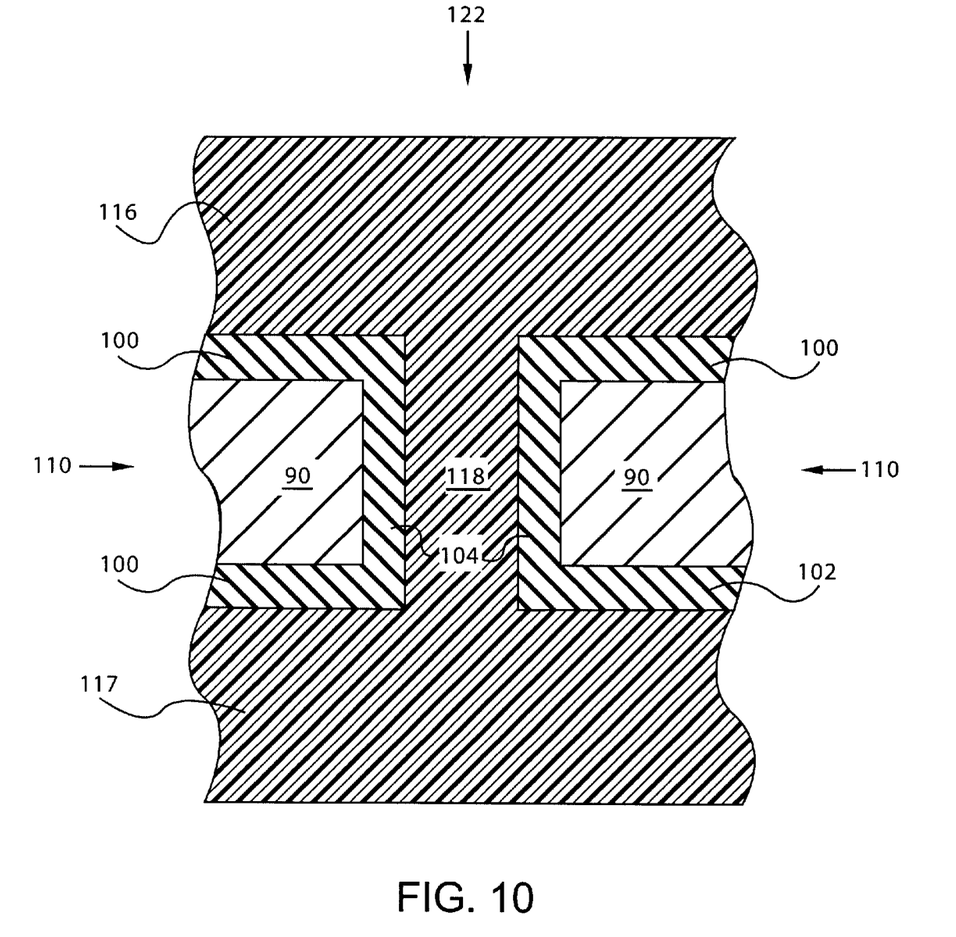
FIG. 10 depicts FIG. 9 after the plated block of Invar has been sandwiched between two dielectric layers, to form a dielectric substrate.

FIG. 10 depicts FIG. 9 after the plated block of Invar 90 has been sandwiched between dielectric layers 116 and 117, to form a dielectric substrate 122. The via 92 (see FIG. 9) may include a dielectric plug 118 comprising dielectric material from the dielectric layers 116 and 117.

Figure 11:
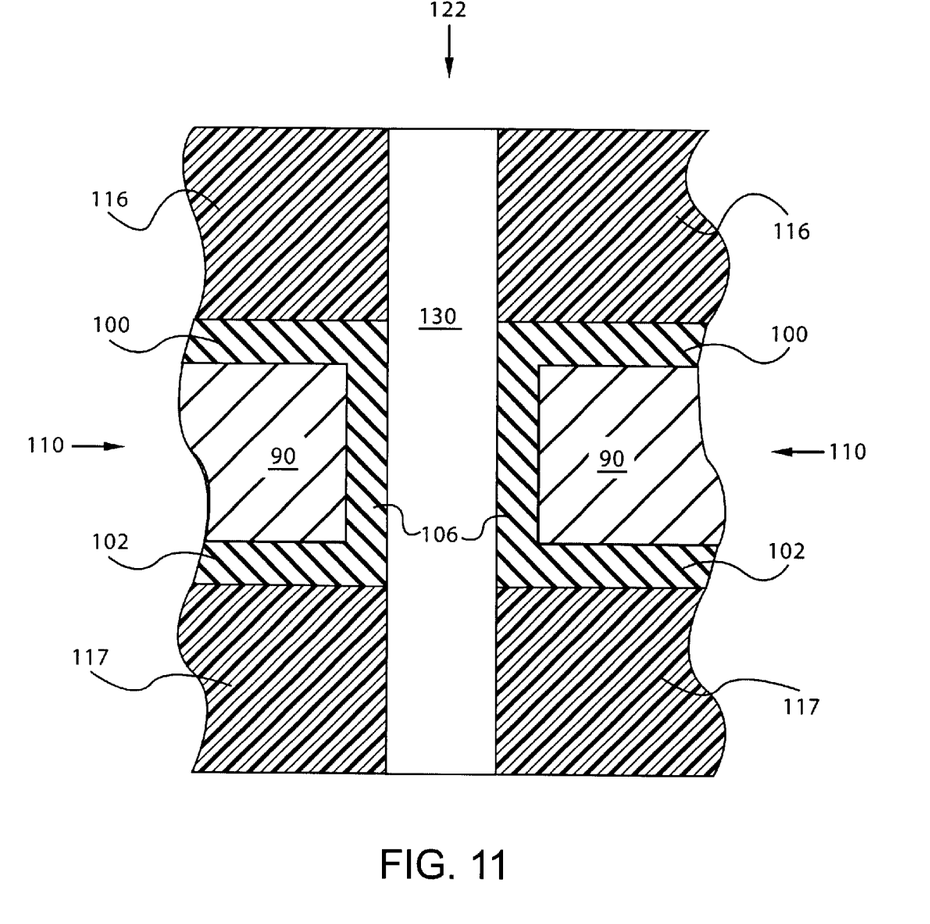
FIG. 11 depicts FIG. 10 after a through hole has been formed in the dielectric substrate.

FIG. 11 illustrates FIG. 10 after a through hole 130 has been formed, by laser or mechanical drilling, in the dielectric substrate 122. The through hole 130 passes through the dielectric plug 118 and through a fraction of the ring of copper 104 thickness, wherein the fraction is greater than 0 and less than 1, and wherein an annular ring of copper 106 of FIG. 11 replaces the ring of copper 104 of FIG. 10. The annular ring of copper 106 prevents the layer of Invar 90 from being exposed to the mechanical or laser drilling, so as to prevent formation of a metal skin which would otherwise be formed if the drilling were to go through Invar material of the layer of Invar 90, as discussed infra in the "Related Arts" section.

Figure 12:
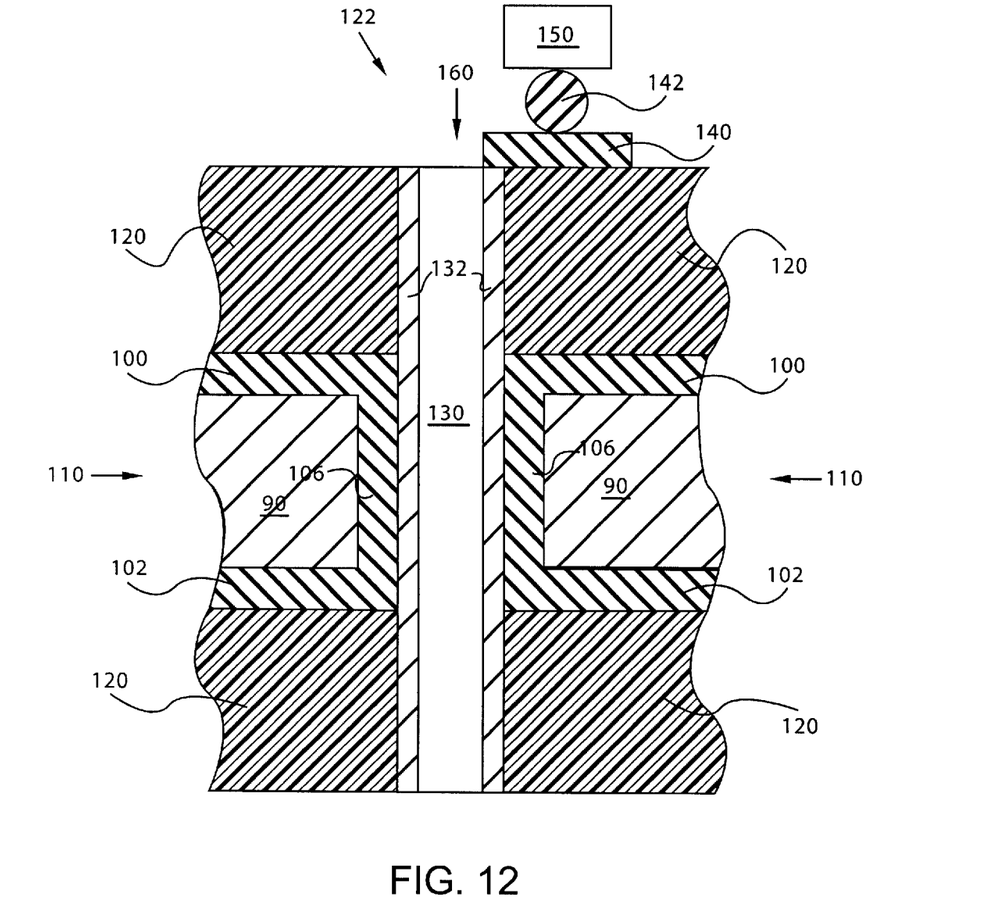
FIG. 12 depicts FIG. 11 after the through hole has been plated with a conductive material to form a plated through hole (PTH), and an electronic component has been conductively coupled to the PTH.

FIG. 12 illustrates FIG. 11 after the through hole 130 is plated with a conductive material, such as copper, to form a plated through hole (PTH) 160 comprising a conductive plating 132 on the through hole 130. The aforementioned plating of the through hole 130 to form the PTH 160 may be accomplished by any method known to one skilled in the art, including a conventional plating method. FIG. 12 also shows an electronic component 150 (such as a chip) conductively coupled to the conductive plating 132 of the PTH 160 by use of a conductive coupler 142 on a conductive pad 140. The conductive coupler 142 may include, inter alia, a solder ball such as a controlled collapse chip connection (4) solder ball.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. An electronic structure that includes a copper-Invar-copper (CIC) laminate, said CIC laminate comprising:
   a block of Invar;
   a first layer of copper;
   a second layer of copper, wherein the block of Invar is sandwiched between the first layer of copper and the second layer of copper;

a first intermetallic layer interfaced between the block of Invar and the first layer of copper, said first intermetallic layer having a thickness not exceeding about 0.50 microns, said first intermetallic layer including constituents of the block of Invar and the first layer of copper such that said constituents of the block of Invar and the first layer of copper include copper, iron, and nickel; and a second intermetallic layer interfaced between the block of Invar and the second layer of copper, said second intermetallic layer having a thickness not exceeding about 0.50 microns, said second intermetallic layer including constituents of the block of Invar and the second layer of copper such that said constituents of the block of Invar and the second layer of copper include copper, iron, and nickel.

2. The electronic structure of claim 1, wherein a thickness of the first layer of copper is uniform, and wherein a thickness of the second layer of copper is uniform.

3. The electronic structure of claim 1 wherein a via passes through the CIC laminate, and wherein the via is plated with a ring of copper, wherein the ring of copper, the first layer of copper, and the second first layer of copper each have about the same grain structure.

4. The electronic structure of claim 3, further comprising:

a first dielectric layer on the first layer of copper;

a second dielectric layer on the second layer of copper; and a through hole through the first dielectric layer and the second dielectric layer, wherein the ring of copper circumscribes the through hole.

5. The electronic structure of claim 4, further comprising:

a conductive plating on a surface of the through hole; and an electronic component conductively coupled to the conductive plating.

6. The electronic structure of claim 5, wherein the electronic component includes a chip.

7. The electronic structure of claim 6, wherein the chip is conductively coupled to the conductive plating by a controlled collapse chip connection (C4) solder ball.

8. The electronic structure of claim 3, wherein the ring of copper is seamlessly connected to the both the first layer of copper and the second layer of copper.

9. The electronic structure of claim 3, further comprising:

a first dielectric layer on the first layer of copper; and a second dielectric layer on the second layer of copper, wherein the via includes a dielectric plug that comprises dielectric material from both the first dielectric layer and the second dielectric layer.

10. The electronic structure of claim 9, wherein the dielectric plug is in contact with both the first dielectric layer and the second dielectric layer.

* * * * *